United States Patent [19]

Sugai et al.

[11] Patent Number: 4,703,501
[45] Date of Patent: Oct. 27, 1987

[54] SOUND MULTIPLEX RECEIVER

[75] Inventors: Yoshiro Sugai; Hiroyuki Kimura, both of Saitama, Japan

[73] Assignee: Pioneer Electronic Corporation, Tokyo, Japan

[21] Appl. No.: 864,656

[22] Filed: May 19, 1986

[30] Foreign Application Priority Data

May 17, 1985 [JP] Japan .................................. 60-103945

[51] Int. Cl.⁴ .............................................. H04H 5/00
[52] U.S. Cl. ........................................ 381/10; 351/11; 351/13; 455/222; 455/297
[58] Field of Search .......................... 381/10, 11, 13; 455/222, 296, 297

[56] References Cited

U.S. PATENT DOCUMENTS 4,399,325  8/1983  Tanaka et al. ......................... 381/11
4,408,098  10/1983  Kamalski ................................ 381/11

Primary Examiner—Forester W. Isen
Attorney, Agent, or Firm—Sughrue, Mion, Zinn, Macpeak & Seas

[57] ABSTRACT

A multiplex sound receiver in which a detection signal is extracted from a broadcast to indicate whether the broadcast is monaural, stereo, or multi-lingual. The detection signal is used for controlling the separating of the channels. According to the invention, the detection signal is processed in accordance with the strength of the broadcast or the noise level. For instance, the detection signal is integrated over a period that is increased when the field strength decreases.

1 Claim, 7 Drawing Figures

SOUND MULTIPLEX RECEIVER

BACKGROUND OF THE INVENTION

1. Related Applications

This application is related to U.S. patent application, Ser. No. 726,753, filed on Apr. 25, 1985, now U.S. Pat. No. 4,680,793, and to Japanese Patent Application 60-97962, corresponding to U.S. patent application Ser. No. 861,184, filed May 10, 1985 both by the present inventors.

2. Field of the Invention

This invention relates to a sound multiplex receiver for receiving sound multiplex broadcasts and which is suitable, for instance, for vehicles.

3. Background Art

One example of a conventional receiver of this type is a television sound multiplex receiver as shown in FIG. 1. In FIG. 1, a sound multiplex discriminating circuit 1 discriminates whether a broadcast is a monaural, stereo or bilingual (multi-language) broadcast. The discriminating circuit 1 includes a Q-signal detecting circuit 1a for subjecting a Q-signal of 3.5 $f_H$ (=55.1 kHz) to AM detection and a stereo/multi-language discriminating circuit 1b for discriminating between stereo and multi-language broadcasts. Further in FIG. 3, a logic circuit 2 controls a matrix circuit 3 with the aid of the output of the sound multiplex discriminating circuit 1 and a mode setting signal. A band-pass filter (BPF) 4 transmits a sub-signal and a Q-signal. A subsignal demodulation circuit 5 receives an output of the band-pass filter 4 and feeds the matrix circuit 3 through a low-pass filter 7. Another low-pass filter 6 receives a sound detection signal and directly feeds the matrix circuit 3.

In the receiver thus organized, a sound detecting circuit (not shown) applies the sound detection signal to the band-pass filter 4 and the low-pass filter 6. Of the signal thus applied, a main signal (L+R) or a main sound signal is supplied through the low-pass filter 6 to the matrix circuit 3, while carriers at frequencies of 2 $f_H$ and 3.5 $f_H$ are passed by the band-pass filter 4. The 3.5 $f_H$ carrier is applied to the sound multiplex discriminating circuit 1, while the 2 $f_H$ carrier is applied to the sub-signal demodulation circuit 5. The sub signal demodulation circuit 5 provides a sub-signal (L−R) or a sub-sound signal at its output terminal, which is applied through the low-pass filter 7 to the matrix circuit 3. As a result, the matrix circuit 3 outputs sound signals separated into the right and left channels.

In the sound multiplex discriminating circuit 1, the 3.5 $f_H$ carrier picked up by the band-pass filter 4 is subjected to AM detection by the Q-signal detecting circuit 1a, to obtain a control signal of 922.5 Hz (multi-language) or 982.5 Hz (stereo). According to the control signal thus obtained, the stereo/multi-language discriminating circuit 1b performs a stereo/multi-language broadcast discrimination. The stereo/multi-language discriminating circuit 1b is generally made up of a PLL (phase-locked loop) circuit. In the discriminating circuit 1b, the free run frequency is set between 922.5 Hz and 982.5 Hz, and the content of the control signal is discriminated by detecting the frequency at which the locking (lock-in) is accomplished.

Discrimination of a monaural broadcast and a sound multiplex broadcast can be achieved in different ways, either by detecting the level of the 3.5 $f_H$ carrier, by detecting the level of the detection output of the Q-signal detecting circuit 1a, by detecting the locking of the PLL circuit of the stereo/multi discriminating circuit 1b, or by detecting the level of the sub-signal applied to the sub-signal demodulation circuit 5, or by combinations of the three methods.

A signal discriminating a monaural, stero or multi-language broadcast as described above, and the mode setting signal are utilized to control the matrix circuit 3 which acts to separate the channels of the broadcast according to the selected mode.

It is assumed that the above-described sound multiplex receiver selects the sub-sound in a bilingual broadcast as shown in the timing diagram (b) of FIG. 2, and the field strength is first decreased to a level $S_1$ and lower and then later restored as shown in the field strength dependence (a) of FIG. 2. In this case, when the externally applied field strength is itself decreased, a monaural reception is effected. However, even after the field strength has been restored, because of the hysteresis or time constant of the sound multiplex discriminating circuit 1, the main monaural sound is continuously outputted until the field strength is restored to a level $S_2$, and then the sub-sound is outputted again, as shown in the timing diagram (b) of FIG. 2.

This phenomenon occurs repeatedly when the field strength is weak and a flutter interference is caused by an airplane, or when a broadcast wave is received while the receiver is moving in a transmission field including multi-path transmissions. In this case, reproduction of the main sound and reproduction of the sub-sound are frequently switched between the two modes and the resultant sounds are not deemed to be acceptable. Furthermore, when pulse-like noise is mixed with the broadcast transmission, sometimes the Q-signal is erroneously detected. That is, problems arise in the presence of a low signal-to-noise ratio.

The above-described erroneous operations may be eliminated to a certain degree by increasing the time constant of the sound multiplex discriminating circuit. However, the method is disadvantageous in the following points. The characteristic of response to the starting and the ending of a sound multiplex broadcast is lowered. Even if, after the field strength is maintained low for a long period of time thus causing a monaural reproduction, the field strength is restored, it takes a relatively long time for the receiver to operate in the sound multiplex mode.

In U.S. patent application Ser. No. 861,184, corresponding to Japanese Patent Application 60-97962, herein incorporated by reference, the present inventors described a sound multiplex receiver, shown in FIG. 3, built according to a USA or West German standard. FIG. 3 will not be described further except as required. However, it is here pointed out that the receiver of FIG. 3 has drawbacks in that a stero identification circuit 26 and a SAP (separate audio program) identification circuit 28 are both composed simply of comparators. As a result, they are likely to malfunction in the presence of fluctuations of the input field strength.

SUMMARY OF THE INVENTION

Accordingly, an object of this invention is to eliminate the above-described difficulties accompanying a conventional sound multiplex receiver.

More specifically, an object of the invention is to provide a sound multiplex receiver in which erroneous operations caused by the variation of the input field strength and the mixing of noise are prevented without lowering its characteristic of response to the starting and the ending of a sound multiplex broadcast.

The foregoing objects or the invention have been achieved by the provision of a sound multiplex receiver having a sound multiplex discriminating circuit for identifying monaural, stereo and bilingual broadcasts according to frequency signals superposed on a broadcast wave. According to the invention, the sound multiplex discriminating circuit comprises a circuit for reprocessing a detection signal which is produced through an identification and a controller for controlling the circuit in response to a field strength decrease detection and/or a noise detection.

The nature, principle and utility of the invention will become more apparent from the following detailed description when read in conjunction with the accompanying drawings, in which like parts are designated by like reference numerals or characters.

BRIEF DESCRIPTION OF THE DRAWINGS

In the accompanying drawings:

FIG. 2, 2a and 2b are a timing diagram for the field strength attenuation performed in the conventional sound multiplex receiver.

DETAILED DESCRIPTION OF THE PREFERRED EMBODIMENTS

Figure 1:
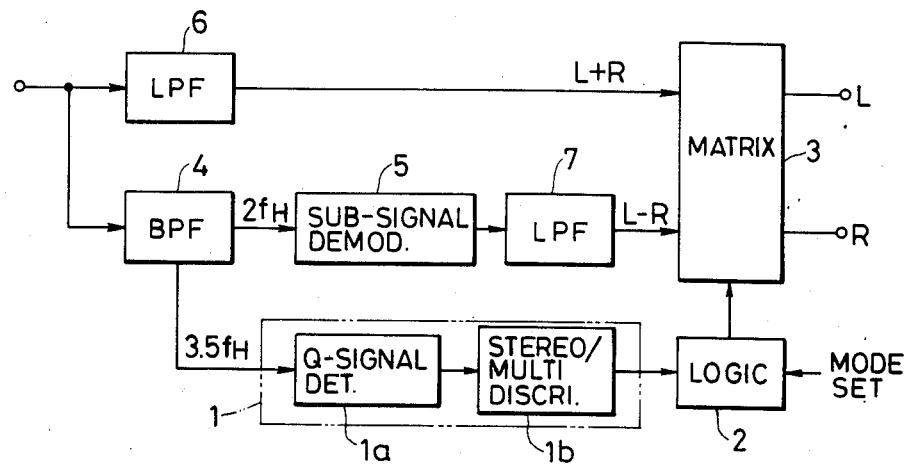
FIG. 1 is block diagram showing a conventional sound multiplex receiver.
Figure 4:
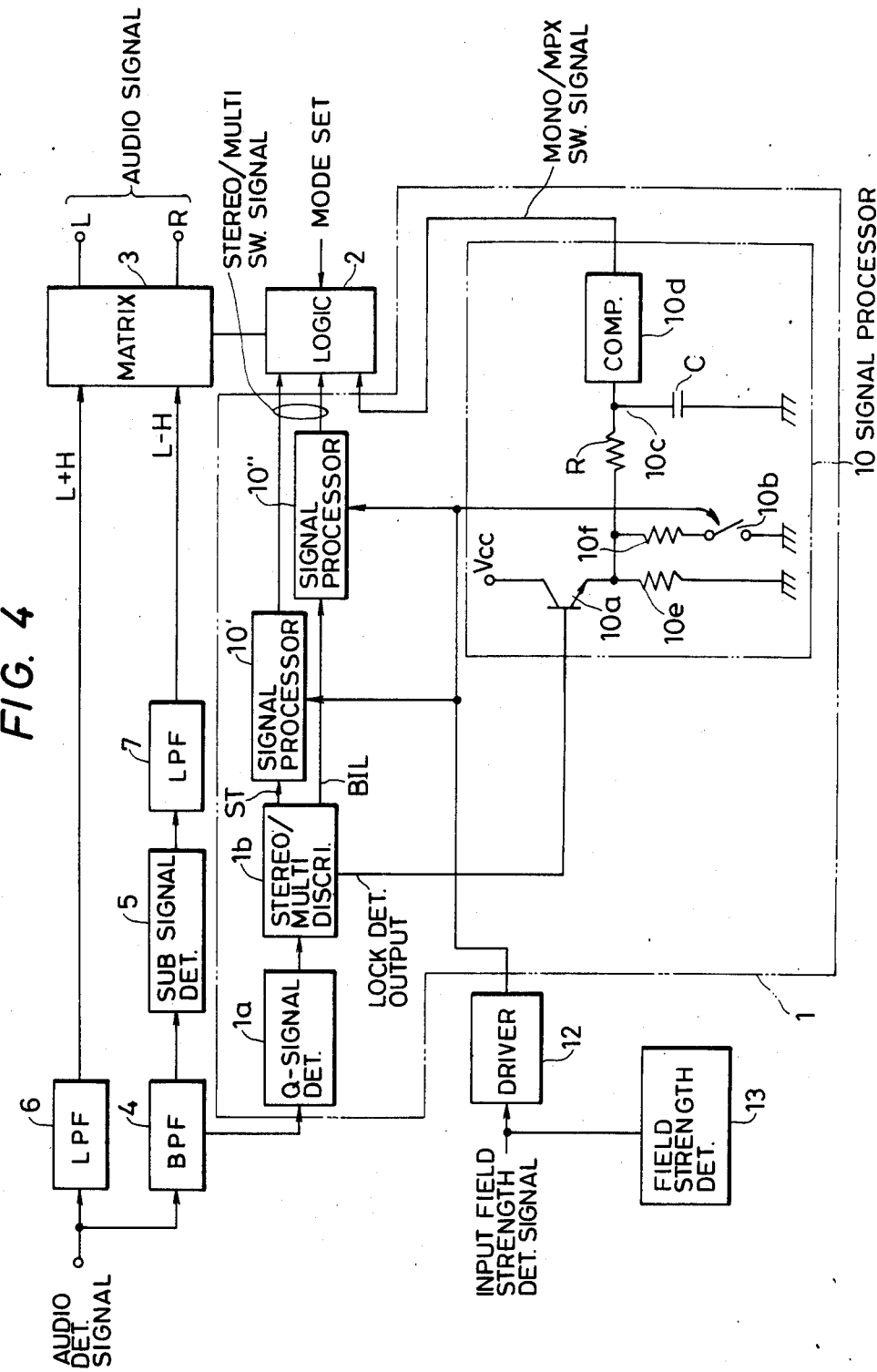
FIG. 4 is a block diagram showing essential circuit elements of one example of a sound multiplex receiver according to this invention.

FIG. 4 is a block diagram showing the essential circuit elements of a sound multiplex receiver according to this invention. In FIG. 4, those components which have been described with reference to FIG. 1 are therefore designated by the same reference numerals or characters.

In FIG. 4, a signal processing circuit 10 processes a lock-in detection output of the stereo/multi-language discriminating circuit 1b. Another signal processing circuit 10' processes a stereo detection output ST of the stereo/multi-language discriminating circuit 1b. Yet another signal processing circuit 10'' processes a multi-language detection output BIL of the stereo/multi-language discriminating circuit 1b. These signal processing circuits 10, 10' and 10'' all have the same design, and only the signal processing circuit 10 is shown in detail.

The signal processing circuit 10 includes an emitter follower circuit having a transistor 10a to the base of which the detection output of stereo/multi-language discriminating circuit is applied. In the signal processing circuit 10, this base connection is by the lock-in detection output, while corresponding base connections are by the stereo detection output ST and the bilingual detection output BIL to the other signal processing circuits 10' and 10''. A switch 10b is turned on and off by the output of a drive circuit 12 (described later). Two resistors 10e and 10f are connected in parallel between ground and the emitter of the transistor 10a. However, the path through the resistor 10f is controlled by the switch 10b. Thus when the switch 10b is on (closed), the resistance between the emitter and ground is reduced. An integrating circuit 10c has a resistor R and a capacitor C. However, the time constant of the integrating circuit 10c is affected by the resistor 10e and the switched resistor 10f. A comparator 10d shapes a waveform output by the integrating circuit 10c and outputs a monaural/sound multiplex change-over signal.

The drive circuit 12 processes an input field strength detection signal outputted by a signal strength meter 13 or the like located in a sound intermediate frequency amplifier circuit (SIF) (not shown). A signal strength meter is described in more detail in Japanese Patent Application No. 60-97962. The driver circuit 12 outputs signals for operating the switch 10b.

Of the outputs of the stereo/multi-language discriminating circuit 1b, the lock-in detection output is raised to a high logic level (hereinafter referred to merely as "H") when a sound multiplex broadcast is detected. The lock-in detection output is set to a low logic level (hereinafter referred to merely as "L") when a monaural broadcast is detected. When a stereo broadcast is received, the stereo detection output ST is raised to "H" while the multi-language detection output BIL is set to "L". When a multi-language broadcast is received, the multi-language detection output BIL is raised to "H" while the stereo detection output ST is set to "L".

When the input field strength is sufficiently large, the drive circuit 12 outputs a signal to turn on (close) the switch 10b. When the switch 10b is maintained turned on, the driving capacity of the emitter follower circuit 10a is nonetheless sufficiently high both in a "take in" direction and in a "take-out" direction.

The detection output of the stereo/multi-language discriminating circuit 1b, after passing through the emitter follower circuit 10a, is integrated by the integrating circuit 10c. The detection output thus integrated is subjected to waveform shaping by the comparator 10d. In this case, since the time constant of the integrating circuit 10c is such that it may be good enough for a noise filter, the characteristic of response to the starting and ending of a sound multiplex broadcast will not be lowered.

When the input field strength is decreased, the switch 10b is turned off (opened), thereby increasing the resistance between the transistor 10a and ground. Therefore, the time constant of the emitter follower circuit 10a is maintained small in the "take-out" direction. However, in the "take-in" direction it is increased because the transistor 10a is cut off. That is, the speed of response is high for a transition from a monaural broadcast to a sound multiplex broadcast, but the speed of response is low for a transition from a sound multiplex broadcast to a monaural broadcast. Therefore, if the field strength drops but thereafter is restored to a high value in a predetermined period of time, the reception of the sound multiplex broadcast can be continued without being shifted to the monaural reception. If, in this case, the receiver continues operating in the sound multiplex mode, then a large noise may be produced. However, the noise can be readily eliminated by soft muting or automatic separation control.

In the case where the input field strength is held low for a long period of time, then monaural reception is effected. Therefore, the receiver of the invention can deal with the case where the sound multiplex broadcast is ended or the stereo broadcast and the multilanguage broadcast are switched over to each other before the field strength is restored high.

In the above-described embodiment of the invention, the field strength detection signal is used to detect the decrease of the input field strength to thereby vary the time constant. However, the decrease of the field strength may be detected by detecting the wide-band noise produced by an FM detector or by using the gate drive signal of a noise canceller.

Figure 2A:
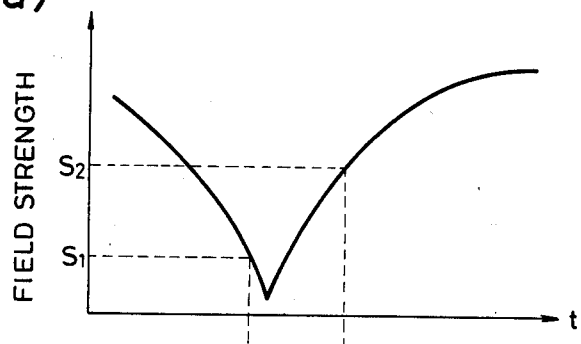
Figure 2B:
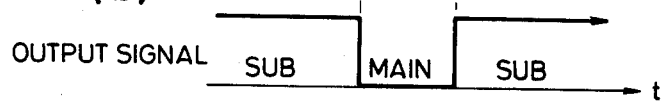

In addition, instead of the time constant, the hysteresis characteristics may be varied in such a manner that the level $S_2$ in shown in the timing diagram (a) of FIG. 2 is decreased or it is held equal to the value which it had a certain time before. Alternatively, these two methods may be employed in combination.

Erroneous operation caused by the mixing of noise can be prevented by providing a countermeasure with the aid of the noise detection signal in such a manner as described above. However, in the case where the noise is removed by using a noise canceller, the Q-signal is also removed. Therefore, the state occurs which is equivalent to that which occurs when the field strength decreases as was described above.

In brief, erroneous operation of the sound multiplex discriminating circuit 1 is caused in the various situations where the Q-signal is lost by the decrease of the input field strength, the Q-signal is erroneously detected because of the noise mixing, or the Q-signal is lost by the sample and hold operation of the noise canceller used to counteract the noise mixing. These causes of erroneous operation can be detected by using the field strength detection signal, the noise detection signal, and the noise canceller gate drive signal. That is, these signals are utilized to hold the previous state for a predetermined period, or vary the hysteresis, or the time constant.

It is pointed out that a field strength detector and a noise detector are both special cases of signal-to-noise detectors in which the other component is assumed to remain constant.

Figure 5:
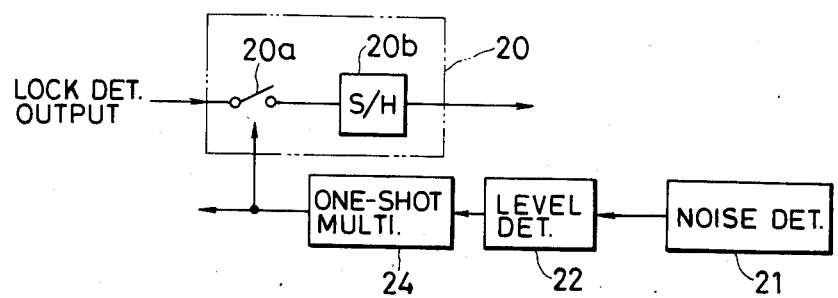
FIG. 5 is a block diagram showing one modification of a part of the sound multiplex receiver of FIG. 4.

FIG. 5 shows one example of a device which uses the noise detection signal from a noise detector 21 to hold the previous state for a predetermined period as was described above. In FIG. 5, a signal processing circuit 20 can be used to replace the above-discussed signal processing circuits 10, 10' and 10" and comprises a normally closed switch 20a, and a sample and hold circuit 20b. The stereo/multi-language discriminating circuit 1b applies the lock-in detection output to the input terminal of the signal processing circuit 20. The signal at the output terminal of the signal processing circuit is applied to the logic circuit 2 (FIG. 4). On the other hand, a level detecting circuit 22 detects when the level of detected noise becomes higher than a predetermined value. As a result of this detection, a one-shot multivibrator 24 is triggered to produce a pulse which lasts for a predetermined period of time. The pulse thus produced is used to maintain the switch 20a open for this predetermined period of time. The sample and hold circuit 20b operates in such a manner that, when the switch 20a is closed, it outputs the input as it is, and, when the switch 20a is opened, it outputs its input which was provided immediately before the switch was opened.

Therefore, if the period of time for which the field strength is decreased is short, the broadcast can be stably received in the same mode maintained prior to the field strength reduction. Since the noise is detected, the device operates not only in the case where the field strength decreases but also in the case where the noise mixing occurs, thus eliminating the difficulty that the Q-signal is erroneously detected during the monaural reception. The device can be readily provided in the form of a C-MOS integrated circuit, for instance, thus being relatively inexpensive.

Two circuits have been described which detect the field strength in order to vary the time constant and which detect the noise to hold the previous state for the predetermined period of time. Combination of these circuits with a circuit using the aforementioned noise canceller gate drive signal can provide a circuit capable of responding to a wider range of states. On the other hand, an inexpensive circuit would respond to a particular state only.

Furthermore, if the average value of the field strength or the number of occurrences of noise, or the frequency of production of noise is detected, then the above-described combination of the circuits can be changed, or the operating point can be moved.

Figure 3:
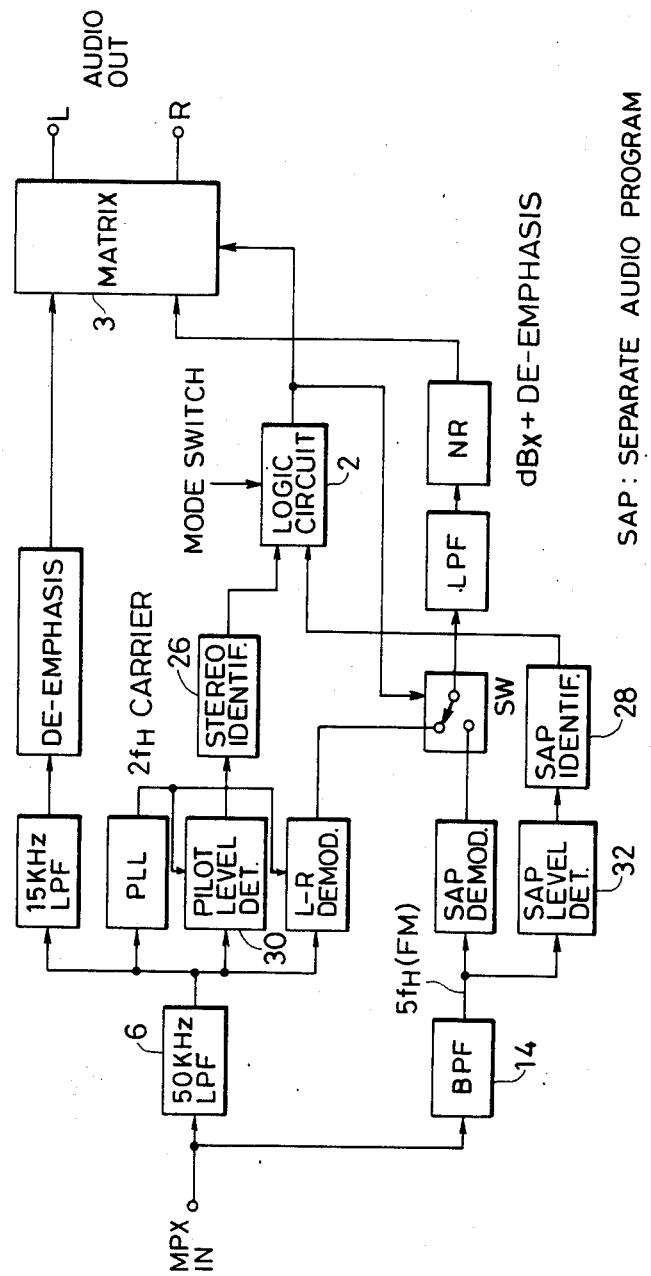
FIG. 3 is a block diagram of another conventional sound multiplex receiver, upon which the present invention is based.

Also, in a sound multiplex receiver, such as that of FIG. 3, built according to the USA or West German standard, the level of the sub-signal or pilot signal is detected or a PLL (phase-locked loop) is utilized to detect the locking of the sub-signal or pilot. Therefore, the technical concept of the invention can be applied to the sound multiplex receiver of the USA and West German systems.

Figure 6:
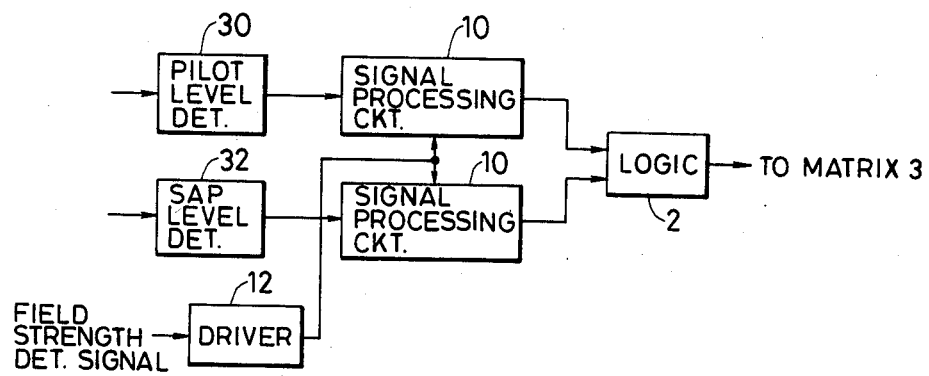
FIG. 6 is a block diagram illustrating the application of the invention to the receiver of FIG. 3.

Thus, the invention can also be advantageously applied to the sound multiplex receiver of FIG. 3. The receiver of FIG. 3 is modified as illustrated by the block diagram of FIG. 6. Just as in FIG. 3, a pilot level detector 30 supplies an indication of the level of the pilot signal to the logic circuit 2 and a SAP level detector 32 supplies an indication of the separate audio program signal to the logic circuit 2. However, two signal processing circuits 10 are placed between the pilot level detector 30 and SAP level detector 32 on one side and the logic circuit 2 on the other side. Each of the signal processing circuits 10 is controlled by the drive circuit 12 receiving the field strength detection signal.

As is apparent from the above description, the sound multiplex receiver according to the invention is so designed that, when the input field strength is decreased or noise is produced, the time constant or hysteresis of the sound multiplex discriminating circuit is varied, or the sound multiplex mode is maintained for the predetermined period of time. Therefore, the receiver of the invention can prevent the erroneous operation of the sound multiplex discriminating circuit in which the sound multiplex mode is frequently switched as the input field strength changes or in which the Q-signal indicating the kind of broadcast is erroneously detected because of noise.

We claim:

1. In a sound multiplex receiver having a sound multiplex discriminating circuit for identifying between a monaural and at least one type of multiplex broadcast from signals superposed on said broadcast and for producing at least one mode signal for controlling channel separating of said broadcasts, a mode signal processor comprising:

processing means for processing a mode signal of a broadcast and controlling separating of channels of said broadcast;

signal strength detecting means for detecting a ratio of signal to noise in said broadcast; and control means for controlling said processing means in response to an output of said signal strength detecting means; wherein said detecting means detects a field strength of said broadcast;

wherein said processing means comprises integrator means for integrating said detection signal;

wherein said integrator means comprises a controllable resistance-capacitance time constant circuit which determines the integration period of said integrator; and wherein said control means controls the time constant circuit to provide an integration period which is longer for a detection signal corresponding to a field strength decrease from a multiplex broadcast signal to a monaural broadcast signal than for a field strength increase from a monaural broadcast field strength to a multiplex broadcast field strength.

\* \* \* \* \*